United States Patent
Pignolo et al.

(10) Patent No.: US 11,632,091 B2
(45) Date of Patent: Apr. 18, 2023

(54) OPERATIONAL AMPLIFIER

(71) Applicant: STMicroelectronics (Grenoble 2) SAS, Grenoble (FR)

(72) Inventors: Philippe Pignolo, Crolles (FR); Pawel Fiedorow, Grenoble (FR); Vincent Rabary, Champagnier (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 17/400,789

(22) Filed: Aug. 12, 2021

(65) Prior Publication Data
US 2022/0077831 A1 Mar. 10, 2022

(30) Foreign Application Priority Data
Sep. 7, 2020 (FR) ..................... 2009059

(51) Int. Cl.
*H03F 3/45* (2006.01)

(52) U.S. Cl.
CPC ..... *H03F 3/45269* (2013.01); *H03F 3/45192* (2013.01); *H03F 3/45475* (2013.01); *H03F 2200/234* (2013.01); *H03F 2200/375* (2013.01)

(58) Field of Classification Search
CPC ........... H03F 3/45269; H03F 2200/375; H03F 2200/234; H03F 3/45192; H03F 3/45475; H03F 2203/45212; H03F 2203/45214; H03F 2203/45354; H03F 2203/45482; H03F 3/45183; H03F 3/45273; H03F 3/45076; H03F 3/45071; H03F 3/45179
See application file for complete search history.

(56) References Cited

U.S. PATENT DOCUMENTS

| | | | |
|---|---|---|---|
| 6,218,895 B1 * | 4/2001 | De | H03K 19/0948 327/566 |
| 9,813,026 B2 * | 11/2017 | Fitzi | H03F 1/26 |
| 2009/0251213 A1 | 10/2009 | Mangudi et al. | |
| 2010/0066413 A1 | 3/2010 | Nessi et al. | |
| 2017/0155386 A1 | 6/2017 | Yuan et al. | |

\* cited by examiner

*Primary Examiner* — Jung Kim
(74) *Attorney, Agent, or Firm* — Slater Matsil, LLP

(57) ABSTRACT

A differential pair for an input stage includes two identical branches in parallel, each branch including a first MOS transistor and a second MOS transistor arranged in series, wherein the first transistor and the second transistor have a channel of the same type, and wherein each of the first transistor and the second transistor has a gate coupled to the same corresponding input of the differential pair and a circuit configured to apply to each of the first transistors a potential difference between a source and a channel-forming region of the first transistor.

21 Claims, 3 Drawing Sheets

OPERATIONAL AMPLIFIER

CROSS-REFERENCE TO RELATED APPLICATIONS

This application claims the benefit of French Patent Application No. 2009059, filed on Sep. 7, 2020, which application is hereby incorporated herein by reference.

TECHNICAL FIELD

The present disclosure generally concerns operational amplifiers and more particularly an input stage of an operational amplifier.

BACKGROUND

Operational amplifiers are currently used in electronic devices or circuits. An operational amplifier generally comprises an input stage, one or a plurality of gain stages, an output stage, and possibly one or a plurality of intermediate stages.

Operational amplifiers having their input stage comprising at least one differential pair in CMOS ("Complementary Metal Oxide Semiconductor") technology, for examples, rail-to-rail operational amplifiers having their input stage comprising a differential pair with P-channel MOS transistors, or PMOS transistors, in parallel with a differential pair with N-channel MOS transistors, or NMOS transistors, are more particularly considered herein.

The differential pairs of such known operational amplifiers have an input offset, which is not desirable.

SUMMARY

There is a need to overcome all or part of the disadvantages of known operational amplifiers, and in particular of the disadvantages of known differential pairs used in input stages of operational amplifiers. In particular, it would be desirable to have a differential pair adapted to a use in an input stage of an operational amplifier which has an input offset which does not vary with a common-mode value applied between the inputs of the differential pair.

Accordingly, embodiments overcome all or part of the disadvantages of known operational amplifiers.

For example, an embodiment overcomes all or part of the disadvantages of known input stages of operational amplifiers.

For example, an embodiment overcomes all or part of the disadvantages of known differential pairs adapted to a use in input stages of operational amplifiers.

For example, an embodiment provides a differential pair capable of being used in an input stage of an operational amplifier which has an input offset independent from a common-mode value applied between inputs of the differential pair.

One embodiment provides a differential pair for an input stage of an operational amplifier comprising:
two identical branches in parallel, each comprising a first MOS transistor and a second MOS transistor with a channel of the same type, cascode-assembled and each having a gate coupled to a same corresponding input of the differential pair; and
a circuit configured to apply to each of the first transistors a potential difference between a source and a channel-forming region of said first transistor.

According to an embodiment, a dimension ratio of each first transistor is X times larger than a dimension ratio of each second transistor.

According to an embodiment, X is in the range from 4 to 10, preferably in the range from 5 to 6.

According to an embodiment, the potential difference is configured to increase, in absolute value, a turn-on threshold of the first transistors.

According to an embodiment, the potential difference is configured so that the first transistors are in saturation state.

According to an embodiment, the potential difference is configured so that an absolute value of a drain-source voltage of each first transistor is greater than an absolute value of a gate-source voltage of said first transistor minus an absolute value of the turn-on threshold of said first transistor.

According to an embodiment:
in each branch, the first transistor has a source coupled to a first end of said branch;
in each branch, the second transistor has a drain coupled to a second end of said branch by an active load of said branch;
the first ends of the branches are coupled to a first node of application of a DC potential by a current source; and
the second ends of the branches are coupled to a second node of application of a second DC voltage.

According to an embodiment, the active load of each branch comprises a resistor in series with a third MOS transistor having a channel of a type opposite to that of the first and second transistors, the resistor being coupled to the second end of the branch and a drain of the third transistor being coupled to a drain of the second transistor of said branch, the third transistors being in mirror of a same fourth MOS transistor.

The differential pair according to claim 7 or 8, wherein the current source comprises a MOS transistor having a channel of the same type as that of the first and second transistors, said transistor having a gate configured to receive a bias potential.

According to an embodiment, said circuit comprises:
a MOS transistor having a channel of the same type as that of the first and second transistors, said transistor having a source coupled to the first node, a drain connected to a channel-forming region of each of the first transistors, the drain of said transistor being further coupled to the source of each of the first transistors by a resistor.

According to an embodiment, in each branch, the second transistor comprises a conduction terminal, preferably its source, connected to a drain of the first transistor, and a conduction terminal forming an output of the differential pair.

Another embodiment provides an operational amplifier comprising an input stage comprising the differential pair described above.

According to an embodiment, the first and second transistors of said differential pair have a P channel.

According to an embodiment, the input stage further comprises another differential pair described above connected in parallel with said differential pair, the first and second transistors of said other differential pair having an N channel, the amplifier being of rail-to-rail type.

According to an embodiment, each differential pair has its outputs coupled to a corresponding folded cascode stage.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the input stages of the operational amplifiers and the other stages (intermediate stage(s), gain stage(s), and output stages) of the operational amplifiers have not been detailed and are known by those skilled in the art.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
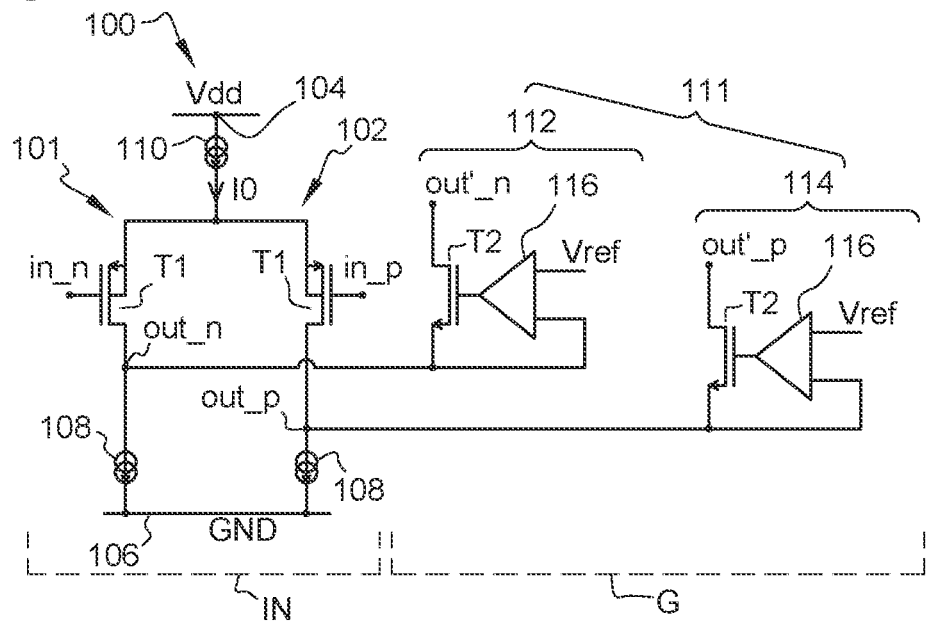
FIG. 1 schematically shows an example of a differential pair of an input stage of an operational amplifier.

FIG. 1 schematically shows an example of a differential pair 100 of an input stage IN of an operational amplifier. In FIG. 1, only a portion of input stage IN and a portion of an example of a gain stage G of the operational amplifier have been shown.

Differential pair 100 comprises two identical branches 101 and 102 connected in parallel between a node or rail 104 of application of a DC potential Vcc and a node or rail 106 of application of a DC potential GND. Potential Vdd is a power supply potential of the operational amplifier. Potential Vdd is positive and referenced to another supply power supply potential, or reference potential, of the operational amplifier, here, potential GND.

Each branch 101, 102 comprises a P-channel MOS or PMOS transistor T1. The transistor T1 of each branch 101, 102 has its source connected to a first end of the branch, its drain coupled to a second end of the branch by an active load 108, in the present example a current source, and its gate connected to a corresponding input in_n or in_p of differential pair 100, or, in other words, of input stage IN. In the example of FIG. 1, the gate of the transistor T1 of branch 101 is connected to input in_n, the gate of transistor T1 of branch 102 being connected to input in_p.

The first ends of branches 101 and 102 are interconnected or, in other words, are confounded. The first ends of branches 101 and 102 are further coupled to node 104 by a same current source 110, configured to deliver a bias current Io. Further, the second end of each branch 101, 102 is connected to node 106.

The drain of the transistor T1 of each branch 101, 102 forms a corresponding output terminal out_n or out_p of differential pair 100 or, in other words, of input stage IN. In the example of FIG. 1, the drain of the transistor T1 of the branch 101 forms output out_n, the drain of the transistor T1 of branch 102 forming output out_p.

In the example of FIG. 1, the gain stage G connected after input stage IN comprises a folded cascode circuit in, circuit in having an input connected to output out_n and an input connected to output out_p.

More particularly, in the example of FIG. 1, circuit in comprises two identical circuits 112 and 114. Each circuit 112, 114 comprises a MOS transistor T2 having a channel of the type opposite to that of transistors T1, that is, with an N channel in the present example. The source of transistor T2 of circuit 112, respectively 114, forms the input of circuit in which is coupled to the output out_n, respectively out_p, of stage IN. Each circuit 112, 114 further comprises a circuit 116 for controlling its transistor T2, here schematically shown by an operational amplifier. Each circuit 116 is configured to deliver a control potential to the gate of the transistor T2 that it controls, so that, in steady state, a potential Vref, for example, positive and referenced to ground GND, is applied to the corresponding output out_n or out_p of stage IN. Each circuit 116 thus comprises an input coupled to the corresponding output out_n or out_p, an input coupled to potential Vref, and an output coupled to the gate of the transistor T2 that it controls. Each circuit 116 is, for example, implemented by an operational amplifier, for example an operational amplifier having a non-inverting input receiving the potential Vref, and an inverting input coupled, preferably connected, to the corresponding output out_n or out_p.

The case where the operational amplifier partially represented in FIG. 1 is of rail-to-rail type is here considered as an example. In this case, and although this has not been shown, stage IN comprises an additional differential pair, connected in parallel to differential pair 100. The additional differential pair is complementary to differential pair 100. In particular, the transistors T1 of the complementary differential pair then are of N-channel type.

In the present example, differential pair 100 is configured to operate with a range of common-mode input values, for example, a range of values from −200 mV to Vdd−1.5 V. As a result, the drain-source voltage of each transistor T1 is in the range, in absolute value, from Vdd−1.5+Vgs−Vref to −0.2+Vgs−Vref in the present example, Vgs being the absolute value of the gate-source voltage of the transistor and Vref being for example equal to 0.3 V. The drain-source voltage of each transistor T1 thus varies with the common-mode value on inputs in_n and in_p.

The inventors have observed that the input offset of differential pair 100 varies with the drain-source voltage of transistors T1, and thus with the common-mode input value of differential pair 100, which is not desirable.

The inventors thus provide making the drain-source voltage of transistors T1 constant, while ensuring that the latter operate in saturation state. For this purpose, the inventors provide placing each transistor T1 in cascode, or, in other words, in series with a MOS transistor having a channel of the same type but of smaller dimensions, by interconnecting the gates of the cascode-assembled transistors. Thus, the drain-source voltage of each transistor T1 is constant and set by the gate-source voltage of transistor T1 and by the gate-source voltage of the transistor with which it is cascode-assembled. Further, to ensure that each transistor T1 remains in saturation state or, in other words, remains saturated, over the entire range of common-mode input values for which the differential pair is provided to operate, the inventors provide, for each transistor T1, applying a non-zero voltage between the source and a channel-forming or body region of transistor T1, this voltage being configured to increase, in absolute value, the turn-on threshold of transistor T1, and thus the gate-source voltage of transistor T1 when it operates in saturation state. In the provided solution, transistor T1 ensures the amplification function and thus determines the input offset of the differential pair, the cascode-assembled transistor being used to maintain the drain-source voltage of transistor T1 constant.

Figure 2:
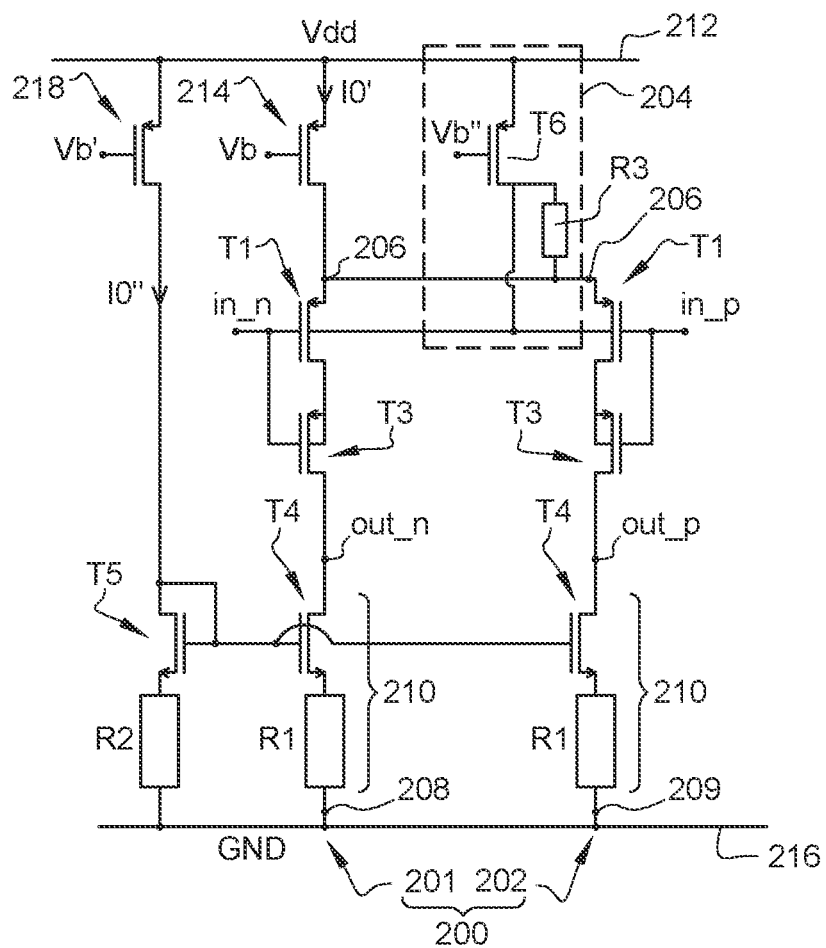
FIG. 2 schematically shows an embodiment of a differential pair of an input stage of an operational amplifier.

FIG. 2 schematically shows an embodiment of such a differential pair 200, differential pair 200 being adapted to a use in an input stage of an operational amplifier, for example, of a rail-to-rail amplifier.

Differential pair 200 comprises two identical branches 201 and 202, connected in parallel to each other.

Each branch 201, 202 comprises a MOS transistor with a P-type channel, or PMOS transistor, T1 and a MOS transistor T3 with a P-type channel.

In each branch 201, 202, transistors T1 and T3 are cascode-assembled. In other words, the source or first conduction terminal of transistor T3 is connected to the drain of transistor T1.

Further, in each branch 201, 202, transistors T1 and T3 have their gates interconnected and coupled, preferably connected, to a corresponding input in_n or in_p of differential pair 200. In the example of FIG. 2, the gates of the transistors T1 and T3 of branch 201 are coupled, preferably connected, to the input in_n of differential pair 200, the gates of the transistors T1 and T3 of branch 202 being coupled, preferably connected, to the input in_p of differential pair 200.

Thus, in each branch 201, 202, the drain-source voltage of transistor T1 is equal to the gate-source voltage of transistor T1 minus the gate-source voltage of transistor T3. This drain-source voltage is thus constant since, on modification of the gate potential of cascode-assembled transistors T1 and T3, the modification of the gate-source voltage of transistor T1 is canceled by the modification of the gate-source voltage of transistor T3.

As an example, in each branch 201, 202, the drain or second conduction terminal of transistor T3 forms, or corresponds to, an output out_n or out_p of differential pair 200. In the example of FIG. 2, the drain of the transistor T3 of branch 201 forms output out_n, the drain of the transistor T3 of branch 202 forming output out_p. Although this is not illustrated in FIG. 2, when differential pair 200 is implemented in an input stage of an operational amplifier, each output out_p, out_n of differential pair 200 is coupled, preferably connected, to a corresponding input of a gain stage. For example, outputs out_n and out_p are connected to respective inputs of a folded cascode circuit, preferably the circuit in described in relation with FIG. 1.

Differential pair 200 further comprises a circuit 204 (delimited by dotted lines in FIG. 2). Circuit 204 is configured to apply, to each of transistors T1, a non-zero voltage between the transistor source and a body region of transistor T1. In other words, circuit 204 is configured to apply, to each of transistors T1, a non-zero source-body voltage.

According to an embodiment, the source-body voltage is configured to increase, in absolute value, the turn-on threshold of transistors T1 with respect to the usual case where the body region of each transistor T1 is connected to the source of this transistor T1, as is the case in FIG. 1. This enables to increase the gate-source voltage of the transistors T1 of differential pair 200 when they operate in saturation state, and thus to increase the drain-source voltage of these transistors T1.

More particularly, according to an embodiment, this source-body voltage is configured so that transistors T1 remain saturated over the entire range of common-mode input values for which the differential pair 200 is provided to operate.

Thus, according to an embodiment, the source-body voltage is configured so that the absolute value of the drain-source voltage of each transistor T1 is greater than the absolute value of the gate-source voltage of transistor T1 minus the absolute value of the turn-on threshold of this transistor T1, over the entire range of common-mode input values for which the differential pair 200 is provided to operate.

According to an embodiment, a dimension ratio of each transistor T1 is X times larger than a dimension ratio of each transistor T3. Preferably, factor X is smaller than or equal to 10, more preferably still smaller than or equal to 6, so that the gate-source voltage of transistors T3 is not too high. Indeed, the higher the gate-source voltage of transistors T3, the higher the source-body voltage applied to transistors T1 should be to provide an operation of transistors T1 in saturation state. Further, preferably, factor X is greater than 4, or even 5. Indeed, the lower factor X is, the higher the stray capacitances of transistors T3, which is not desirable. In particular, the higher the input capacitance of the transistors T3, the more the input capacitance of an operational amplifier including the pair 200 as an input stage increases, while it is preferable that the input capacitance of an operational amplifier is as low as possible.

In FIG. 2, the transistor T1 of each branch 201, 202 has its source coupled, preferably connected, to a first end 206 of the branch. The ends 206 of branches 201 and 202 are here confounded. Further, the transistor T3 of branch 201, respectively 202, has its drain coupled to a second end 208, respectively 209, of the branch, via an active load 210 of said branch.

In this embodiment where transistors T1 and T3 have a P channel, the first ends 206 of branches 201 and 202 are coupled to a rail or node 212 by a current source 214, node 212 being configured to receive a DC power supply potential Vdd. The current source 214 delivers a constant current Io'.

Further, in this embodiment where transistors T1 and T3 have a P channel, the second ends 208 and 209 of branches 201 and 202 are coupled, preferably connected, to a rail or node 216 configured to receive a DC reference potential GND. Potential Vdd is positive and referenced to potential GND. When differential pair 200 is implemented in an input stage of an operational amplifier, the latter is preferably supplied with the difference between potentials Vdd and GND.

According to an example of implementation mode, current source 214 is a P-channel MOS transistor having its source coupled, preferably connected, to rail 212, having its drain coupled, preferably connected, to the ends 206 of branches 201 and 202, and having its gate receiving a bias potential Vb.

According to an embodiment, the load 210 of each branch 201, 202 comprises a resistor R1 in series with an N-channel MOS transistor T4. The resistor R1 of branch 201, respectively 202, is on the side of end 208, respectively 209, of said branch coupled, for example, connected, to the end 208, respectively 209, of said branch. The transistors T4 of the two branches 201 and 202 are assembled as a mirror of a same transistor T5, that is, the drain and the gate of transistor T5 are connected together and to the gates of transistors T4.

More exactly, in the example of FIG. 2, the resistor R1 of branch 201, respectively 202, comprises a first terminal coupled, preferably connected, to end 208, respectively 209, of the branch. The resistor R1 of branch 201, respectively 202, comprises a second terminal coupled, preferably connected, to the source of the transistor T4 of the branch. In each branch 201, 202, the drain of the transistor T4 of the branch is coupled, preferably connected, to the drain of the transistor T3 of this branch.

Further, in the example of FIG. 2, similarly to transistor T4, transistor T5 has its source coupled to node 216 by a resistor R2, transistor T5 being for example identical to transistors T4 and resistor R2 being for example identical to resistors RT. The drain of transistor T5 is for example coupled to node 212 by a current source 218 delivering a constant current Io", for example, equal to current Io'. As an example, current source 218 is a P-channel MOS transistor having its source coupled, preferably connected, to rail 212, having its drain coupled, preferably connected, to the drain of transistor T5, and having its gate receiving a DC bias potential Vb'. Preferably, transistors 218 and 214 are identical and potentials Vb and Vb' are identical.

According to an embodiment, circuit 204 comprises a P-channel MOS transistor T6 having its source coupled, preferably connected, to node 212, having its drain connected to the body region of each of transistors T1, and having its gate receiving a DC bias potential Vb". Circuit 204 further comprises a resistor R3 coupling the drain of transistor T6 to the source of each of transistors T1. For example, a first terminal of resistor R3 is connected to the drain of transistor T6, a second terminal of resistor R3 being connected to the body regions of transistors T1. Transistor T6 forms a current source configured to deliver a current flowing through resistor R3, the voltage drop between the terminals of resistor R3 determining the source-body voltage of transistors T1. Preferably, the current supplied by transistor T6 is negligible as compared with the current Io' delivered by current source 214, for example, at least 10 times smaller, preferably at least 20 times smaller, and more preferably still at least 30 times smaller.

Preferably, transistors T6 and 214 have their gates connected together, potential Vb" then being identical to potential Vb. In this case, the ratio of the dimensions of transistor T6 is at least 10 times smaller, preferably at least 20 times smaller, and more preferably at least 30 times smaller, than that of transistor 214.

As an example, when the differential pair is implemented in a rail-to-rail operational amplifier and is provided to operate over a range of common-mode input values from −200 mV to Vdd−1.5 V, the source-body voltage of transistors T1 may be selected so that the drain-source voltage of transistors T1 is equal to 150 mV.

For the example of the above paragraph, the inventors have observed that the value of the input offset varies at most by 2 µV over the entire range of common-mode input values, while for the differential pair 100 (FIG. 1) having transistors T1 identical to those of differential pair 200, the value of the input offset varies by at least 200 µV over this same range of common-mode input values.

Differential pair 200 may be used in an input stage of a rail-to-rail operational amplifier, but also in operational amplifiers which are not of rail-to-rail type.

According to an embodiment where differential pair 200 is implemented in an input stage of a rail-to-rail operational amplifier, the input stage further comprises another differential pair with N-channel MOS transistors, connected in parallel with differential pair 200, between nodes 212 and 216. The forming of such a differential pair with N-channel transistors is known by those skilled in the art.

Figure 3:
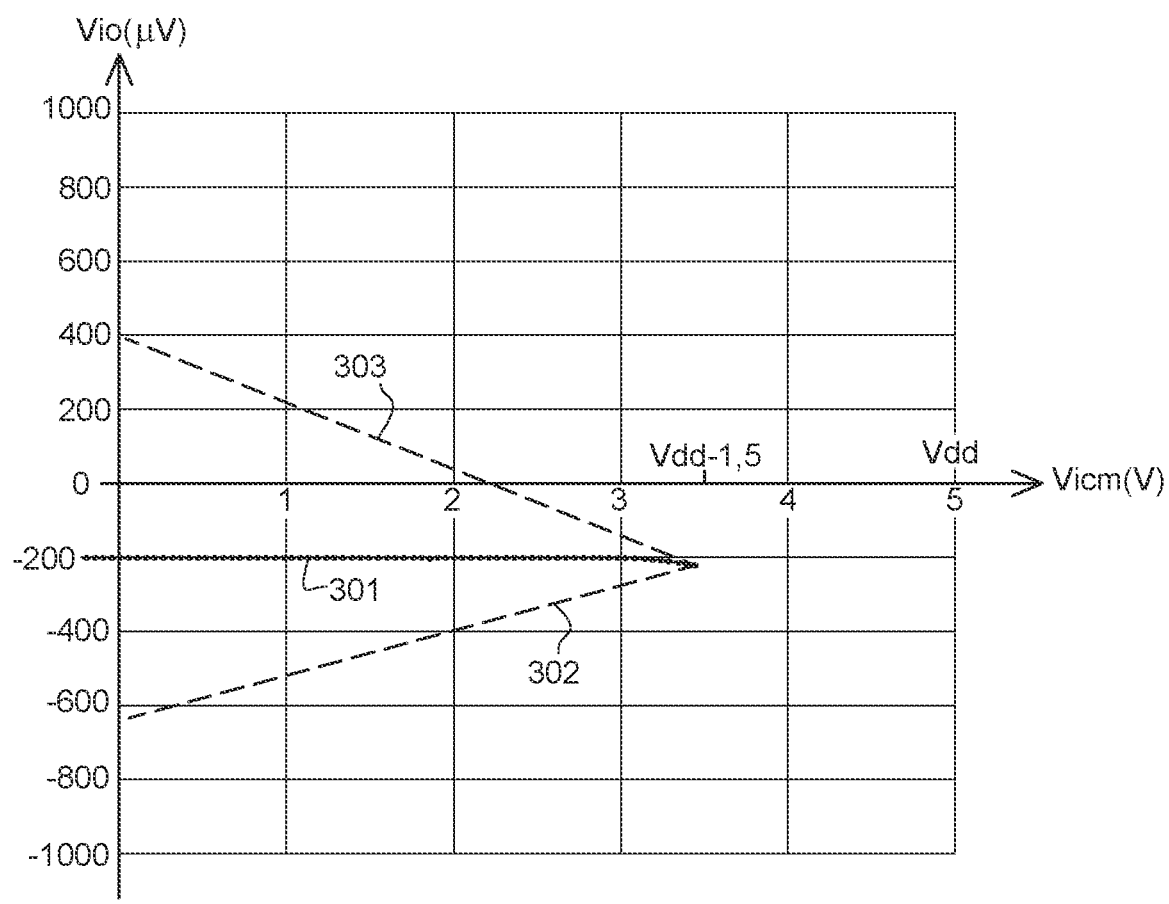
FIG. 3 illustrates, for the differential pair of FIG. 2 and for examples of differential pairs of the type of that of FIG. 1, examples of changes in the input offset as a function of the value of the input common-mode.

FIG. 3 illustrates, by curves 301, 302 and 303, examples of variation of the input offset Vio, in micro volts (µV), as a function of the value of the input common-mode Vicm, in volts (V), for the differential pair 200 (curve 301) and for examples of differential pairs of the type described in relation to FIG. 1 (curves 302 and 303).

Differential pairs implemented in a rail-to-rail operational amplifier and intended to operate over a range of input common-mode Vicm values ranging from −200 mV to Vdd−1.5 V, with Vdd equal to 5 V, are here considered as an example. For the differential pair 200, the source-body voltage of the transistors T1 is for example chosen so that the drain-source voltage of the transistors T1 is equal to 150 mV.

As illustrated by the curve 301 for the differential pair 200, the input offset Vio is constant, at plus or minus 2 µV, over the entire considered range of values of input common-mode Vicm.

On the other hand, as illustrated by the curves 302 and 303, in a differential pair of the type described in relation to FIG. 1, the input offset Vio varies by several hundred of micro volts over the entire considered range of values of input common-mode Vicm.

A differential pair 200 with P-channel MOS transistors T1 has been described up to now. The solution provided by the inventors to decrease the variation of the input offset of a differential pair over the range of common-mode input values for which the differential pair is provided to operate may also be implemented in a differential pair with N-channel MOS transistors T1, as will now be described.

Figure 4:
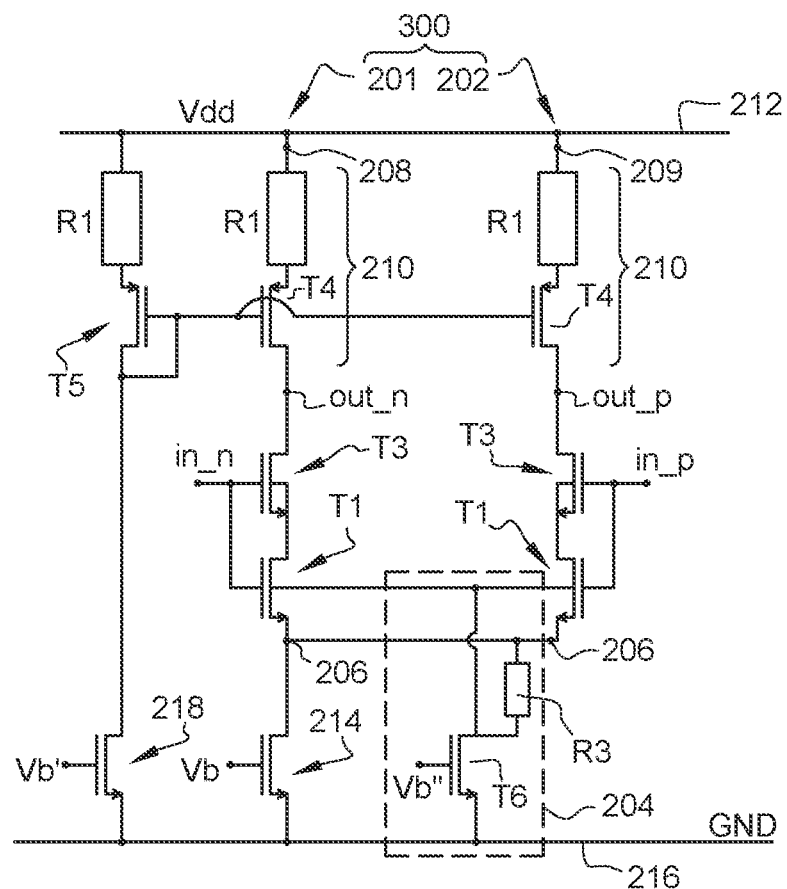
FIG. 4 schematically shows another embodiment of a differential pair of an input stage of an operational amplifier.

FIG. 4 schematically shows another embodiment of a differential pair 300 adapted to a use in an input stage of an operational amplifier, for example, of a rail-to-rail operational amplifier.

More particularly, the differential pair 300 of FIG. 4 is similar to that of FIG. 2, with the difference that:
the P-channel transistors, and particularly the transistors T1 amplifying the differential mode, are replaced with N-channel transistors;
the N-channel transistors are replaced with P-channel transistors;
the rails 216 and 212 receiving respective potentials GND and Vdd are exchanged; and potentials Vb, Vb', and Vb" are accordingly adapted.

When it is indicated that, in FIG. 4, the rails 216 and 212 receiving the respective potentials GND and Vdd are exchanged relative to what has been described in relation to FIG. 2, this means that when an element or a terminal is coupled or connected to one of the two rails 216 and 212 in FIG. 2, this element or this terminal is respectively connected or connected to the other of the two rails 216 and 212 in FIG. 4. For example, the second ends 208 and 209 of the branches 201 and 202 are coupled, preferably connected, to the rail 216 receiving the potential GND in FIG. 2, while they are coupled, preferably connected, to the rail 212 receiving the potential Vdd in FIG. 4.

For the rest, the description of differential pair 200 made in relation with FIG. 2 applies to the differential pair 300 of FIG. 4, with the difference that rails 212 and 216 are exchanged, which means, in particular, that, in FIG. 4, the ends 206 of branches 201 and 202 of differential pair 300 are coupled to rail 216 at potential GND and that the ends 208 and 209 of the respective branches 201 and 202 of differential pair 300 are coupled to rail 212 at potential Vdd.

Further, similarly to what has been indicated for the differential pair 200 of FIG. 2, outputs out_n and out_p of differential pair 300 may be connected to a folded cascode circuit, for example, a folded cascode circuit which differs from circuit 111 (FIG. 1) by the value of the potential Vref that it receives and by the fact that its transistors T2 have a P channel.

Figure 5:
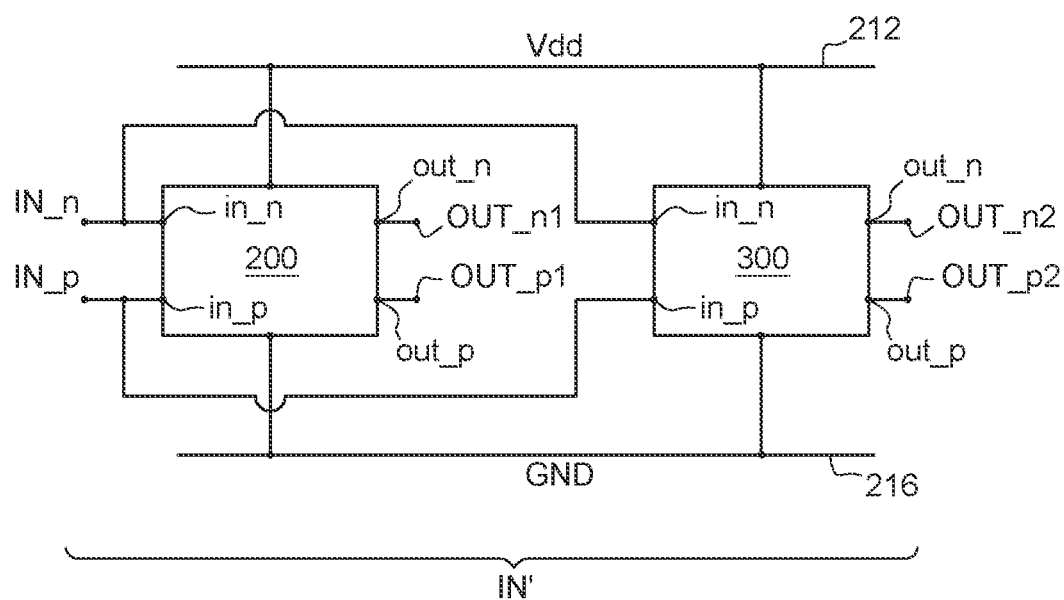
FIG. 5 schematically shows in the form of blocks an embodiment of an input stage of an operational amplifier.

FIG. 5 schematically shows in the form of blocks an embodiment of an input stage IN' of an operational amplifier, and more particularly of a rail-to-rail amplifier.

Input stage IN' comprises differential pair 200 shown in the form of a block. Differential pair 200 is connected between rails 212 and 216, as illustrated in FIG. 2. The input in_n, respectively in_p, of differential pair 200 is coupled, preferably connected, to an input IN_n, respectively IN_p, of stage IN', inputs IN_n and IN_p corresponding to the respectively inverting and non-inverting inputs of the operational amplifier. The outputs out_n and out_p of differential pair 200 form respective outputs OUT_n1 and OUT_p1 of stage IN'.

According to an embodiment, input stage IN' further comprises differential pair 300 shown in the form of a block. Differential pair 300 is connected between rails 212 and 216, as illustrated in FIG. 4. The input in_n, respectively in_p, of differential pair 300 is coupled, preferably connected, to the input IN_n, respectively IN_p, of stage IN'. The outputs out_n and out_p of differential pair 300 form respective outputs OUT_n2 and OUT_p2 of stage IN'.

Thus, stage IN' comprises two inputs IN_n and IN_p and four outputs OUT_n1, OUT_n2, OUT_p1, and OUT_p2. By combining, at the level of an intermediate stage (not shown) of the amplifier, the outputs OUT_n1 or OUT_p1 of differential pair 200 with the outputs OUT_n2 and OUT_p2 of differential pair 300, the amplifier then implements a rail-to-rail operation.

In an alternative embodiment, not illustrated, differential pair 300 comprising N-channel transistors T1 is replaced with a usual differential pair comprising N-channel MOS transistors. A step of calibration of the differential pair comprising N-channel MOS transistors may then be provided to ensure the continuity of the input offset between the range of common-mode inputs values for which the outputs of differential pair 200 are used, and the range of common-mode inputs values for which the outputs of the differential pair comprising N-channel MOS transistors are used.

The combination of the outputs of a differential pair comprising P-channel MOS transistors with the outputs of a differential pair comprising N-channel MOS transistors connected in parallel with the differential pair comprising P-channel MOS transistors is known by those skilled in the art, which is capable of implementing this combination in the case where differential pair 200 is connected in parallel with differential pair 300 or with a usual differential pair comprising N-channel MOS transistors.

Further, although this is not illustrated in FIG. 5, preferably, before being combined at the level of an intermediate stage, the implementation of which is within the abilities of those skilled in the art, outputs OUT_n1, OUT_n2, OUT_p1, and OUT_p2 are each delivered to a gain stage, for example, to respective circuits of this gain stage, each of the circuits for example being a folded cascode circuit, preferably a folded cascode circuit such as described in relation with FIG. 1. In the case where outputs OUT_n2 and OUT_p2 of differential pair 300 are each supplied to a folded cascode circuit of the type described in relation with FIG. 1, potential Vref is adapted, for example, to be equal to Vdd−0.3 V and the transistors T2 of these circuits have an N channel rather than a P channel.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove. In particular, it will be within the abilities of those skilled in the art to associate differential pair 200 and/or differential pair 300 with folded cascode circuits different from those described hereabove, or even with gain circuits which are not folded cascode circuits.

What is claimed is:

1. A differential pair for an input stage comprising:
   two identical branches in parallel, each branch comprising a first MOS transistor and a second MOS transistor arranged in series, wherein the first transistor and the second transistor have a channel of the same type, and wherein each of the first transistor and the second transistor has a gate coupled to the same corresponding input of the differential pair; and
   a circuit configured to apply to each of the first transistors a potential difference between a source and a channel-forming region of the first transistor,
   wherein a dimension ratio of each first transistor is X times larger than a dimension ratio of each second transistor and X is larger than 1.

2. The differential pair according to claim 1, wherein X is in a range from 4 to 10.

3. The differential pair according to claim 2, wherein X is in a range from 5 to 6.

4. The differential pair according to claim 1, wherein the potential difference is configured to increase, in absolute value, a turn-on threshold of the first transistors.

5. The differential pair according to claim 4, wherein the potential difference is configured so that the first transistors are in a saturation state.

6. The differential pair according to claim 4, wherein the potential difference is configured so that an absolute value of a drain-source voltage of each first transistor is greater than an absolute value of a gate-source voltage of the first transistor minus an absolute value of the turn-on threshold of the first transistor.

7. The differential pair according to claim 1,
   wherein the first transistor in each branch has a source coupled to a first end of the branch,
   wherein the second transistor in each branch has a drain coupled to a second end of the branch by an active load of the branch,
   wherein the first ends of the branches are coupled to a first node by a current source, the first node configured to be at a first DC voltage, and
   wherein the second ends of the branches are coupled to a second node configured to be at a second DC voltage.

8. The differential pair according to claim 7, wherein the first DC voltage is Vdd and the second DC voltage is GND.

9. The differential pair according to claim 7, wherein the first DC voltage is GND and the second DC voltage is Vdd.

10. The differential pair according to claim 7,
wherein the active load comprises a resistor in series with a third MOS transistor having a channel of a type opposite to that of the first and second transistors, and
wherein the resistor is coupled to the second end of the branch and a drain of the third transistor is coupled to a drain of the second transistor of the branch, the third MOS transistors being a mirror of a fourth MOS transistor and the third and fourth MOS transistors being the same.

11. The differential pair according to claim 7, wherein the circuit comprises:
a circuit MOS transistor having a channel of the same type as that of the first and second transistors, wherein the circuit MOS transistor has a source coupled to the first node and a drain connected to a channel-forming region of each of the first transistors, and wherein the drain of the circuit MOS transistor is further coupled to the source of each of the first transistors by a resistor.

12. The differential pair according to claim 1, wherein, in each branch, the second transistor comprises a conduction terminal connected to a drain of the first transistor, and a conduction terminal forming an output of the differential pair.

13. The differential pair according to claim 12, wherein the conduction terminal connected to the drain is a source.

14. An operational amplifier comprising:
the input stage comprising a first differential pair according to claim 1.

15. The operational amplifier according to claim 14, wherein the first and second transistors of the first differential pair have a P channel.

16. The operational amplifier according to claim 15, wherein the input stage further comprises a second differential pair connected in parallel with the first differential pair, the second differential pair being of the same construction as the first differential pair, wherein a first transistor and a second transistor of the second differential pair have an N channel, and wherein the operational amplifier is a rail-to-rail type amplifier.

17. The operational amplifier according to claim 14, wherein, in each branch of the first differential pair, the second transistor comprises a conduction terminal connected to a drain of the first transistor, and a conduction terminal forming an output of the differential pair, and wherein the differential pair has its outputs coupled to a corresponding folded cascode stage.

18. The operational amplifier according to claim 17, wherein the conduction terminal connected to the drain of the first transistor is a source.

19. A differential pair for an input stage comprising:
two identical branches in parallel, each branch comprising a first MOS transistor and a second MOS transistor arranged in series, wherein the first transistor and the second transistor have a channel of the same type, and wherein each of the first transistor and the second transistor has a gate coupled to the same corresponding input of the differential pair; and
a circuit configured to apply to each of the first transistors a potential difference between a source and a channel-forming region of the first transistor,
wherein the first transistor in each branch has a source coupled to a first end of the branch,
wherein the second transistor in each branch has a drain coupled to a second end of the branch by an active load of the branch,
wherein the first ends of the branches are coupled to a first node by a current source, the first node configured to be at a first DC voltage,
wherein the second ends of the branches are coupled to a second node configured to be at a second DC voltage,
wherein the active load comprises a resistor in series with a third MOS transistor having a channel of a type opposite to that of the first and second transistors,
wherein the resistor is coupled to the second end of the branch and a drain of the third transistor is coupled to a drain of the second transistor of the branch, the third MOS transistors being a mirror of a fourth MOS transistor and the third and fourth MOS transistors being the same.

20. The differential pair according to claim 19, wherein the current source comprises a current source MOS transistor having a channel of the same type as that of the first and second transistors, the current source MOS transistor having a gate configured to be at a bias potential.

21. An operational amplifier comprising:
an input stage comprising:
a first differential pair comprising:
two identical branches in parallel, each branch comprising a first MOS transistor and a second MOS transistor arranged in series, wherein the first transistor and the second transistor have a channel of the same type, and wherein each of the first transistor and the second transistor has a gate coupled to the same corresponding input of the first differential pair; and
a circuit configured to apply to each of the first transistors a potential difference between a source and a channel-forming region of the first transistor,
wherein the first and second transistors of the first differential pair have a P channel; and
a second differential pair connected in parallel with the first differential pair, the second differential pair being of the same construction as the first differential pair,
wherein a first transistor and a second transistor of the second differential pair have an N channel, and
wherein the operational amplifier is a rail-to-rail type amplifier.

* * * * *